United States Patent
Kurose et al.

(10) Patent No.: US 7,032,207 B2
(45) Date of Patent: Apr. 18, 2006

(54) METHOD OF DESIGNING SEMICONDUCTOR INTEGRATED CIRCUIT WITH ACCURATE CAPACITANCE EXTRACTION

(75) Inventors: Shinichi Kurose, Kawasaki (JP); Kenji Kumagai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 11 days.

(21) Appl. No.: 10/762,277

(22) Filed: Jan. 23, 2004

(65) Prior Publication Data

US 2004/0168144 A1    Aug. 26, 2004

(30) Foreign Application Priority Data

Feb. 26, 2003    (JP) .............. 2003-049375

(51) Int. Cl.
*G06F 17/50* (2006.01)
(52) U.S. Cl. ............................. 716/12; 716/5
(58) Field of Classification Search .............. 716/8–15, 716/5
See application file for complete search history.

(56) References Cited

U.S. PATENT DOCUMENTS

| | | | |
|---|---|---|---|
| 5,699,289 A * | 12/1997 | Takenaka ............ | 365/51 |
| 6,536,027 B1 * | 3/2003 | Grinchuk et al. ...... | 716/12 |
| 6,703,706 B1 * | 3/2004 | Audet et al. ......... | 257/713 |
| 6,779,167 B1 * | 8/2004 | Igarashi et al. ....... | 716/13 |
| 6,851,100 B1 * | 2/2005 | You et al. ........... | 716/11 |

FOREIGN PATENT DOCUMENTS

| | | |
|---|---|---|
| JP | 2002-024310 | 1/2002 |
| JP | 2002-270775 | 9/2002 |

* cited by examiner

*Primary Examiner*—Stacy A. Whitmore
*Assistant Examiner*—Binh Tat
(74) *Attorney, Agent, or Firm*—Staas & Halsey LLP

(57) ABSTRACT

A semiconductor integrated circuit includes a block having a first border edge on which an external connection terminal is provided and a second border edge on which no external connection terminal is provided, a wiring prohibited area which extends a first distance from the first border edge and in which no wiring line running parallel to the first border edge exists, and a shielding line which is at a second distance from the second border edge and runs parallel to the second border edge.

5 Claims, 13 Drawing Sheets

METHOD OF DESIGNING SEMICONDUCTOR INTEGRATED CIRCUIT WITH ACCURATE CAPACITANCE EXTRACTION

BACKGROUND OF THE INVENTION

1. Field of the Invention

The present invention generally relates to methods of designing semiconductor integrated circuits and semiconductor integrated circuits designed by such methods, and particularly relates to a method of designing a physical block in the hierarchical designing of semiconductor integrated circuits and to a semiconductor integrated circuit designed by such method.

2. Description of the Related Art

In the designing of semiconductor integrated circuits, the delay of each wiring and each gate needs to be identified in order to calculate overall delays by simulation. The delay of wiring has been becoming a predominant factor affecting overall delays as semiconductor integrated circuits are implemented through increasingly fine layouts. It thus becomes necessary to obtain accurate delays by extracting an effect of cross-talk and capacitance between wiring lines from information about wiring intervals.

As the scale of semiconductor integrated circuits increases, a flat design method that determines the layout of an entire circuitry at once may encounter a problem in that data size exceeds the processing limits of design tools. In consideration of this, a hierarchical designing method that determines the layouts of physical blocks divided on a function-by-function basis and combines these layouts is now more often used than before.

In the hierarchical designing method, layouts are determined separately for each physical block. When an effect of cross-talk and capacitance between wiring lines are to be estimated by focusing attention on the outside of a physical block, wiring patterns inside this physical block are not known. Thus, an assumption is made that no wiring pattern is in existence inside the physical block, or that a wiring pattern exists close to the border inside the physical block, thereby allowing an effect of cross-talk and capacitance between wire lines to be extracted. By the same token, when attention is focused on the inside of a physical block, wiring patterns outside this physical block are not known. Thus, an assumption is made that no wiring pattern is in existence outside the physical block, or that a wiring pattern exists close to the border outside the physical block, thereby allowing an effect of cross-talk and capacitance between wire lines to be extracted.

A related art (Patent Document 1) teaches a method of producing macros that can suppress the variation of characteristics such as signal delays caused by cross-talk noise. In this method, an area where chip-level wiring lines can pass through is identified in a macro, and wire lines are automatically laid out inside the macro based on the wiring conditions of the identified area, thereby generating a macro library including information about passing-line assignable areas and automatic wiring line layouts. This allows chip-level wiring lines to pass through the passing-line assignable areas, thereby suppressing cross-talk between inside-macro wiring lines and chip-level wiring lines.

[Patent Document 1]

Japanese Patent Application Publication No. 2002-024310

SUMMARY OF THE INVENTION

It is a general object of the present invention to provide a method of designing a semiconductor integrated circuit and a semiconductor integrated circuit designed by such a method that substantially obviate one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a method of designing a semiconductor integrated circuit and a semiconductor integrated circuit designed by such a method particularly pointed out in the specification in such full, clear, concise, and exact terms as to enable a person having ordinary skill in the art to practice the invention.

To achieve these and other advantages in accordance with the purpose of the invention, the invention provides a semiconductor integrated circuit, including a block having a first border edge on which an external connection terminal is provided and a second border edge on which no external connection terminal is provided, a wiring prohibited area which extends a first distance from the first border edge and in which no wiring line running parallel to the first border edge exists, and a shielding line which is at a second distance from the second border edge and runs parallel to the second border edge.

According to another aspect of the invention, a method of designing a semiconductor integrated circuit includes the steps of a) checking each border edge of a block area so as to determine whether a border edge is a first border edge where an external connection terminal is provided or a second border edge where no external connection terminal is provided, b) providing a wiring prohibited area which extends a first distance from the first border edge and in which no wiring line running parallel to the first border edge exists, and c) providing a shielding line which is at a second distance from the second border edge and runs parallel to the second border edge.

In the designing of the semiconductor integrated circuit as described above, with respect to a block such as a physical block, a shielding line is provided for a border edge where no external connection terminal is situated, and a wiring prohibited area having no wiring line running parallel to a border edge is provided for a border edge where an external connection terminal is situated. This creates a condition in which a wiring pattern (shielding line) is always present near the border with respect to the edge where the shielding line is provided, and also creates a condition in which no wiring pattern is in existent near the border without exception with respect to the edge where the wiring prohibited area is provided. Accordingly, when capacitance is to be extracted around the border of the physical block, processing is performed on the one hand by taking into account the wiring pattern (shielding line) that is always present, and is performed on the other hand by completely disregarding an effect of wiring patterns. High accuracy is thus guaranteed for capacitance extraction.

Further, processing is automated by checking the presence/absence of an external connection terminal and thereby easily distinguishing an edge where a shielding line should be provided and an edge where a wiring prohibited area should be provided. The processing can thus be performed in a short period of time, thereby suppressing an adverse effect on the design TAT (turn around time) as much as possible.

Other objects and further features of the present invention will be apparent from the following detailed description when read in conjunction with the accompanying drawings.

DESCRIPTION OF THE PREFERRED EMBODIMENTS

When an effect of cross-talk and capacitance between wiring lines are extracted based on an assumption that there is no wiring pattern, no problem arises with regard to the accuracy of extracted capacitance if no wiring pattern actually exists near the border. If a wiring pattern is present near the border, the accuracy of extracted capacitance is not satisfactory. By the same token, when an effect of cross-talk and capacitance between wiring lines are extracted by assuming that a wiring pattern exists near the border, no problem arises with regard to the accuracy of extracted capacitance if a wiring pattern actually exists near the border. If a wiring pattern is not present near the border, the accuracy of extracted capacitance is not satisfactory.

In such a case, a simulated operation and an actual operation do not match. This causes a problem that the semiconductor integrated circuit does not properly operate, or a problem that the manufacturing yield drops even if the semiconductor integrated circuit properly operates.

In order to obviate this problem, in the case of memory macros or the like, shielding lines may be provided along the border of a macro so as to enclose the macro. If shielding lines are provided to enclose a physical block, however, external connection terminals provided near the border of the physical block for the purpose of electrically coupling the inside and outside of the physical block are short-circuited through such shielding lines. In order to avoid this, shielding lines near the external connection terminals need to be removed. Such a measure results in an increase of the design TAT (turn around time), especially for physical blocks having a large number of external connection terminals.

Accordingly, there is a need for a design method that can guarantee the accuracy of cross-talk effect extraction and capacitance extraction on the border of a physical block without affecting the design TAT, and also a need for a semiconductor integrated circuit designed by such a design method.

In the following, embodiments of the present invention will be described with reference to the accompanying drawings.

A description will be first given of physical blocks to which a design method according to the invention is applied.

Figure 1:
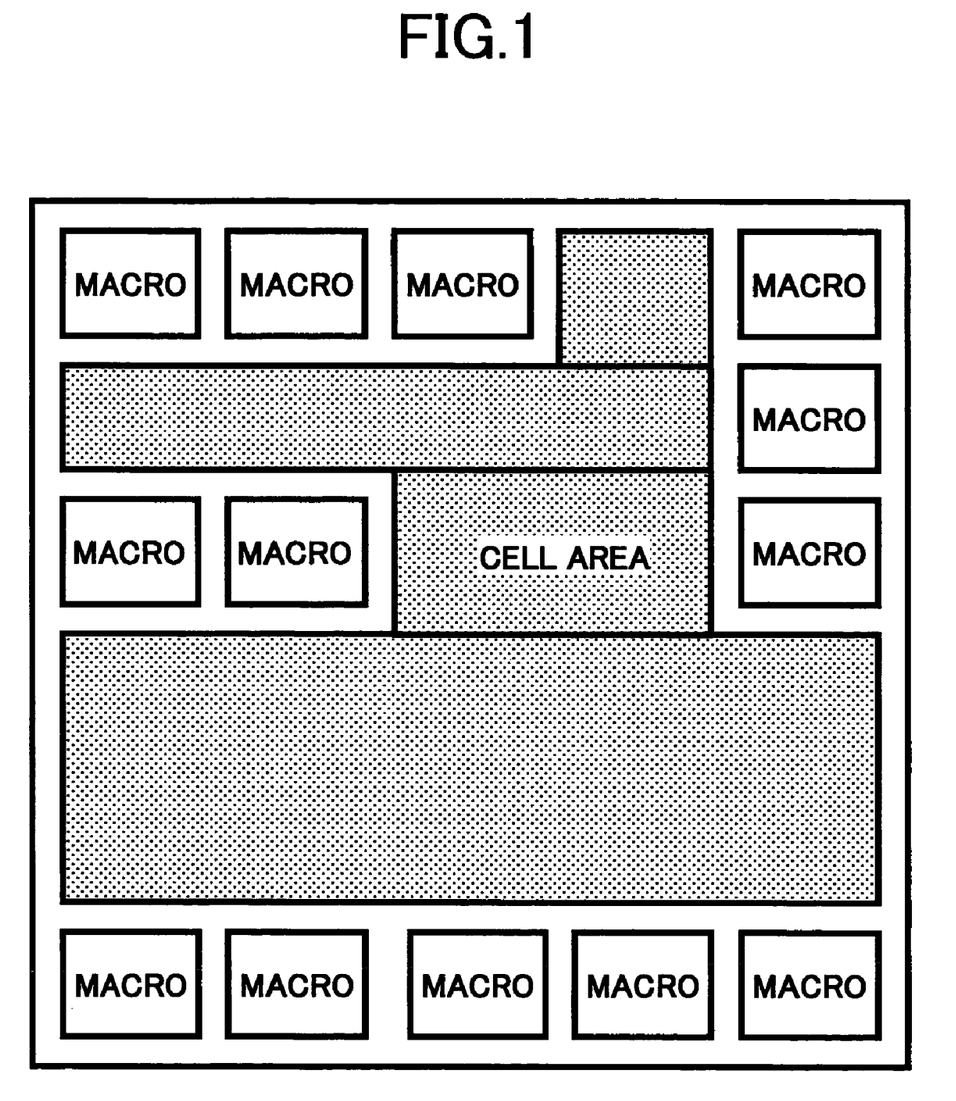
FIG. 1 is an illustrative drawing showing a semiconductor integrated circuit when a hierarchical designing method is not employed.

Physical blocks are layout areas into which a semiconductor integrated circuit is divided at the time of designing based on the hierarchical designing method, and are also referred to as hierarchical layout blocks. FIG. 1 is an illustrative drawing showing a semiconductor integrated circuit when the hierarchical designing method is not employed. The semiconductor integrated circuit includes cells such as a NAND gate, a NOR gate, etc., and macros such as a RAM, a ROM, a PLL, a multiplier, etc.

Figure 2:
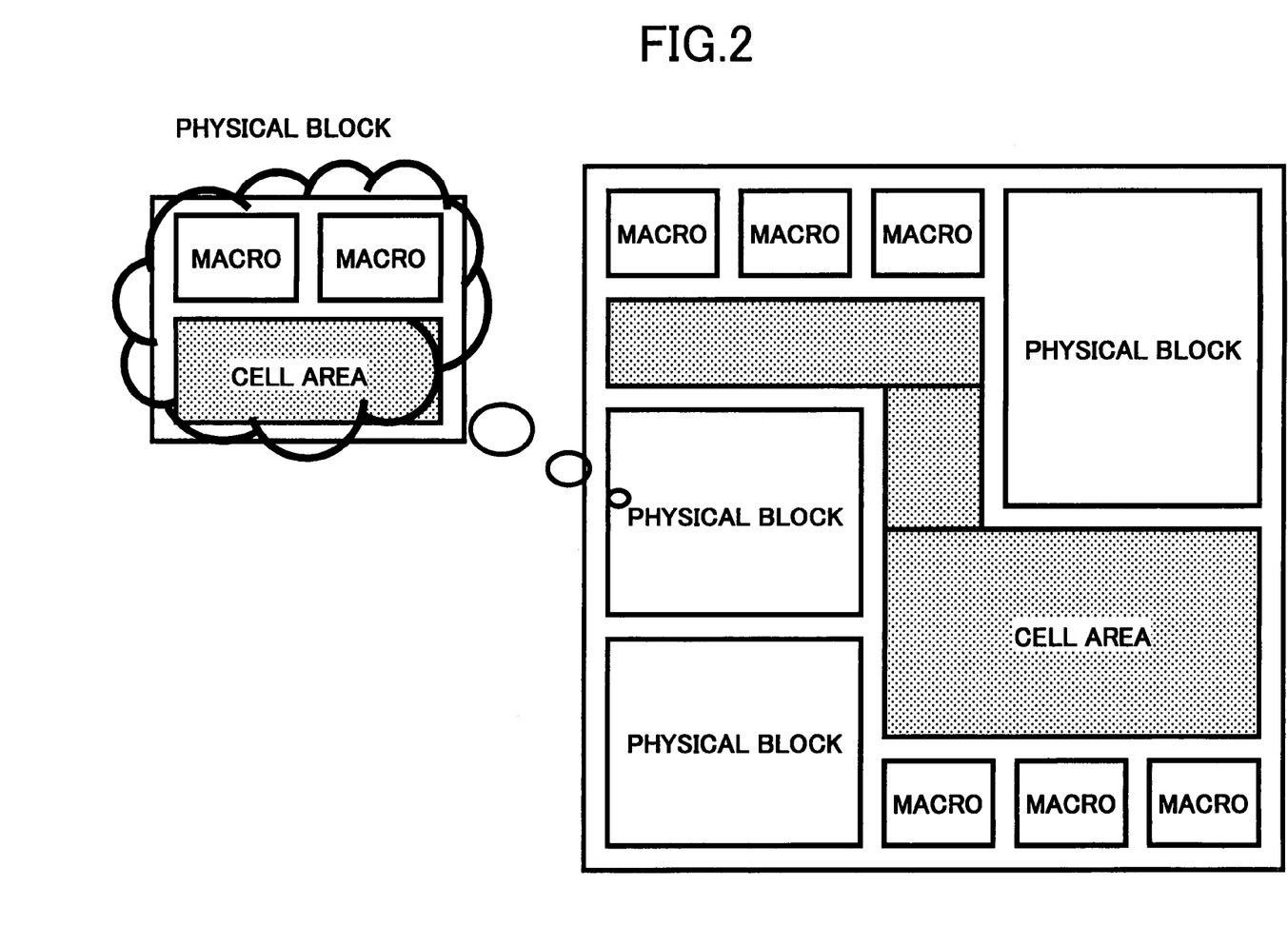
FIG. 2 is an illustrative drawing showing a semiconductor integrated circuit when the hierarchical designing method is used.

FIG. 2 is an illustrative drawing showing a semiconductor integrated circuit when the hierarchical designing method is used. In the case of the hierarchical designing method, physical blocks are present in the circuitry in addition to the cell areas and macros as described above. Only one physical block may be in existence, or more than one physical block may be provided. Like the cell areas and macros, a plurality of different physical blocks may be provided, or a plurality of identical physical blocks may be in existence. A physical block is designed by a designer who is different from the designer who designs the entire circuitry (i.e., at the top level). The designer of the entire circuitry treats the physical block as a black box when attending to circuitry designing. Namely, physical blocks are treated in the same manner as macros at the time of design.

In actuality, since physical blocks are layout areas that are divided on a function-by-function basis, the physical blocks each include cell areas and macros in the same manner as at the top level. The designer of the physical blocks attends to designing and creates libraries with respect to such construction, so that the physical blocks are treated as black boxes at the top level. Moreover, a further physical block may be created inside a physical block in a nested structure. At the time of designing of such a physical block, the physical block situated inside a physical block is treated as a black box in the same manner as designing at the top level.

Layout processing to which the invention is directed determines a circuitry layout based on logic-circuit information that is obtained by logic designing performed at a preceding stage, thereby generating a physical mask pattern. Such processing is referred to as physical designing as opposed to logic designing.

Figure 3:
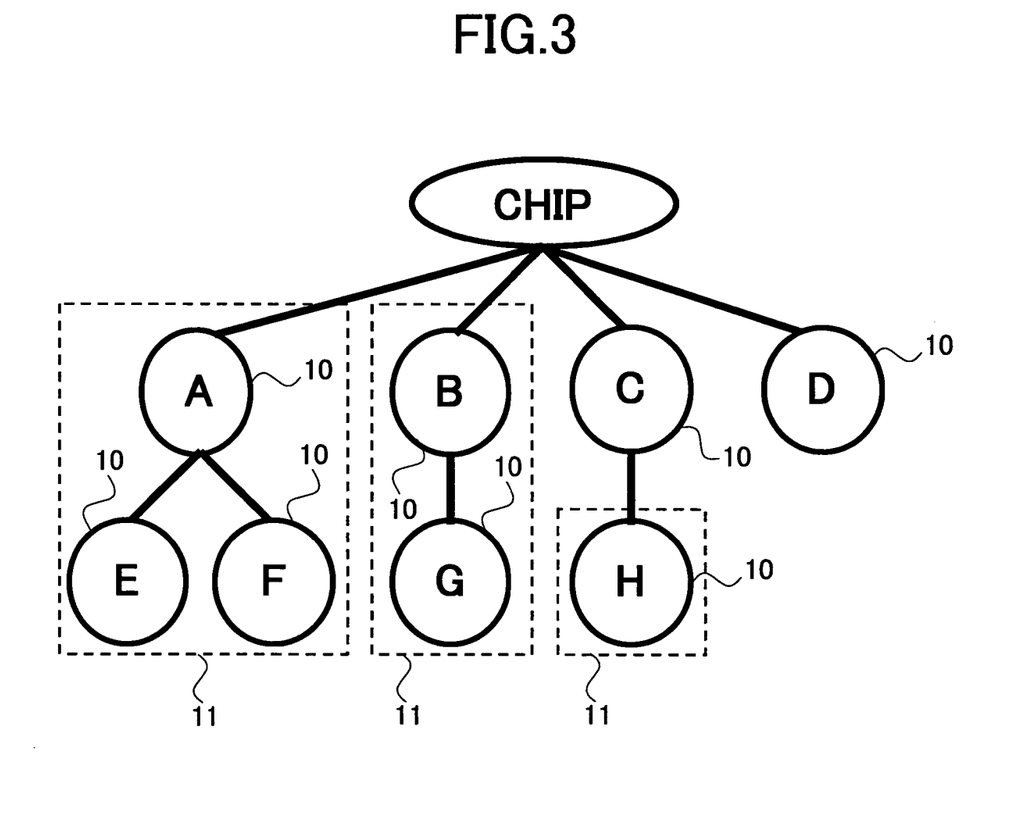
FIG. 3 is an illustrative drawing showing a hierarchical structure of logic modules.

Even in logic designing, circuits called logic modules that are divided on a function-by-function basis are built up in a hierarchical structure to generate an entire circuit when logic circuits at the gate level are to be generated. FIG. 3 is an illustrative drawing showing a hierarchical structure of logic modules. In FIG. 3, A through H each represent a logic module 10 at the time of logic designing. The entire circuit of a semiconductor integrated circuit is comprised of the logic modules 10 corresponding to A through H. A, B, and C further include the logic modules 10 corresponding to E through H.

In hierarchical designing at the layout design (physical design) level, a hierarchy is not partitioned by the same units as the logic modules, but a plurality of logic modules may be combined to generate a single layout unit. Further, logic modules strongly relating to each other may not be treated as hierarchical levels, but may be designed at the top level. A dotted-line frame 11 shown in FIG. 3 is an example of such a layout unit. In this example, A (including E and F), B (including G), and H are treated as a physical layer 11, and remaining modules are designed at the top level.

In this manner, a hierarchy at the time of layout designing is different from a hierarchy at the time of logic designing, and, thus, is referred to as a physical hierarchy as opposed to a logical hierarchy. A physical hierarchical level is then treated as a layout area (block) 11. In the specification, such layout area 11 is referred as a physical layer block or a physical block.

Figure 4:
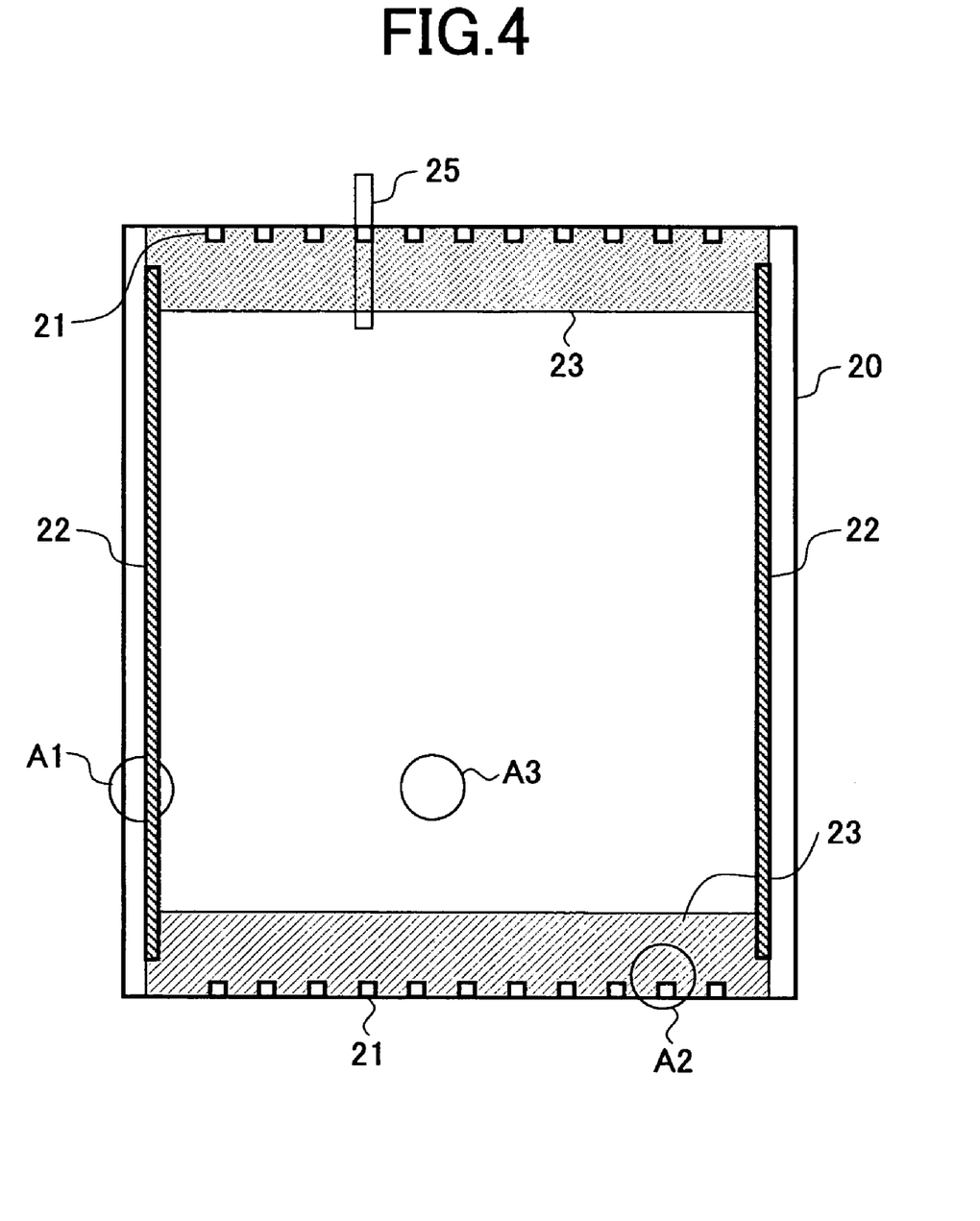
FIG. 4 is a plane view of a physical block according to the invention.

FIG. 4 is a plane view of a physical block according to the invention.

In FIG. 4, a physical block 20 includes external connection terminals 21, shielding lines 22, and wiring prohibited areas 23. A wiring line 25 is connected to one of the external connection terminals 21.

In the invention, the shielding lines 22 are provided on, inside, outside, or inside and outside the boundary of the physical block 20. In the example of FIG. 4, the shielding lines 22 are positioned inside the boundary of the physical block 20. The shielding lines 22 are coupled via power-supply lines or contacts to power-supply terminals that are provided at another wiring layer. Since the external connection terminals 21 for electrical connection between an inside and an outside of the. physical block are provided near the border of the physical block 20, enclosing the physical block 20 by providing the shielding lines along the entire perimeter results in short-circuiting between the shielding lines 22 and the external connection terminals 21 or between the shielding lines 22 and the wiring line 25 connected to the external connection terminals 21.

In consideration of this, the shielding lines 22 are not provided along the border of the physical block 20 where the external connection terminals 21 are situated, and the wiring prohibited areas 23 are instead generated. In the wiring prohibited areas 23, wiring lines extending parallel to the border of the physical block 20 are prohibited, thereby making it unnecessary to take into account an effect of cross-talk and wiring capacitance between an inside and an outside of the physical block 20. The size or width of the wiring prohibited areas 23 is determined such as to make it unnecessary to take into consideration a cross-talk effect and wiring capacitance.

With this provision, a cross-talk effect and capacitance are properly extracted between the shielding lines 22 and wiring lines situated inside the border of the physical block 20 with respect to the edges (border) where the shielding lines 22 are provided. With respect to the edges (border) where the wiring prohibited areas 23 are provided, on the other hand, a cross-talk effect and capacitance are properly extracted without regard to an effect of outside wiring. In this manner, the accuracy of capacitance extraction is successfully maintained at high accuracy.

Further, wiring patterns situated outside the border of the physical block 20 can be processed by assuming that wiring lines (i.e., the shielding lines 22) are in existence inside the physical block 20 close to the border with respect to the edges where the shielding lines 22 are provided. With respect to the edges where the wiring prohibited areas 23 are provided, on the other hand, wiring patterns situated outside the border of the physical block 20 can be processed by assuming that no wiring is present close to the border. In this manner, the accuracy of capacitance extraction is successfully maintained at high accuracy in the same manner as in the inside of the border.

In actual layout processing, wiring lines can only be laid out on the lines of a defined mesh, which is referred to as a wiring grid. Further, rules are defined such that the wiring lines are laid out in either one of a vertical direction and a horizontal direction that is given different priority for each wiring layer. (Hereinafter, a direction that is given priority is referred to as a priority wiring direction, and a direction perpendicular to the priority wiring direction is referred to as a non-priority wiring direction.) Intervals of the wiring grids are set to a minimum wiring distance that is defined by libraries. The minimum wiring distance is determined on a technology-specific basis according to the limitation of the manufacturing technology.

It is assumed here that the priority wiring direction in the wiring layer of interest is a vertical direction, and the non-priority wiring direction is a horizontal direction. The external connection terminals 21 at this wiring layer are then provided on a top edge or a bottom edge by taking into account convenience for connection. (If the external connection terminals 21 need to be provided on a left edge or a right edge, a different wiring layer is used.) Accordingly, the shielding lines 22 end up being provided on the left edge and the right edge, and the wiring prohibited areas 23 are provided on the top edge and the bottom edge.

Figure 5A:
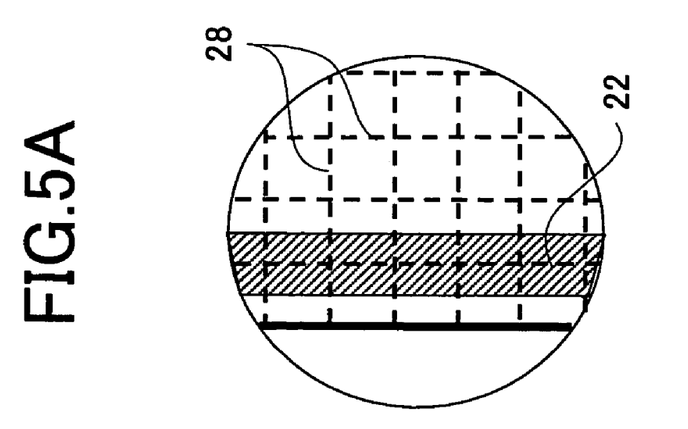
FIG. 5A is an expanded view of an area A1 that is situated around the border of the physical block in FIG. 4.

Positions where the shielding lines 22 are generated are determined such that no other wiring lines can pass between the border of the physical block and the shielding lines 22. In actual layout processing, wiring lines are laid out on the wiring grids, so that it suffices to provide the shielding lines 22 on the outermost wiring grids of the physical block 20. FIG. 5A is an expanded view of an area Al that is situated around the border of the physical block in FIG. 4. Dotted lines 28 represent the position of wiring grids. As shown in FIG. 5A, the shielding lines 22 are provided on the outermost wiring grids of the physical block 20.

Figures 5B, 5C:
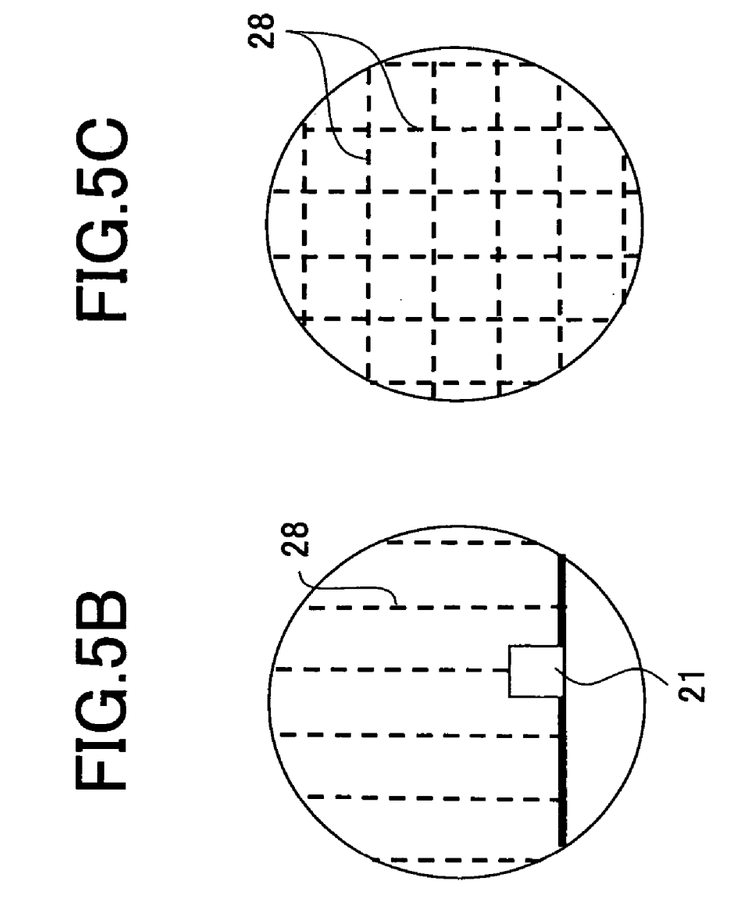
FIG. 5B is an expanded view of an area A2 that is situated around the border of the physical block in FIG. 4.
FIG. 5C is an expanded view of an area A3 that is situated inside the physical block in FIG. 4.

The wiring prohibited areas 23 may be properly set by defining in libraries a preset distance from the border of the physical block and by removing the wiring grids that run parallel to the border of the physical block within the preset distance. FIG. 5B is an expanded view of an area A2 that is situated around the border of the physical block in FIG. 4. Dotted lines 28 represent the position of wiring grids. As shown in FIG. 5B, the wiring grids that run parallel to the border of the physical block are removed in the wiring prohibited areas 23.

FIG. 5C is an expanded view of an area A3 that is situated inside the physical block in FIG. 4. Dotted lines 28 represent the position of wiring grids. As shown in FIG. 5C, wiring grids are laid out so as to extend both in the vertical direction and in the horizontal direction in the areas other than the wiring prohibited areas 23.

Figure 6:
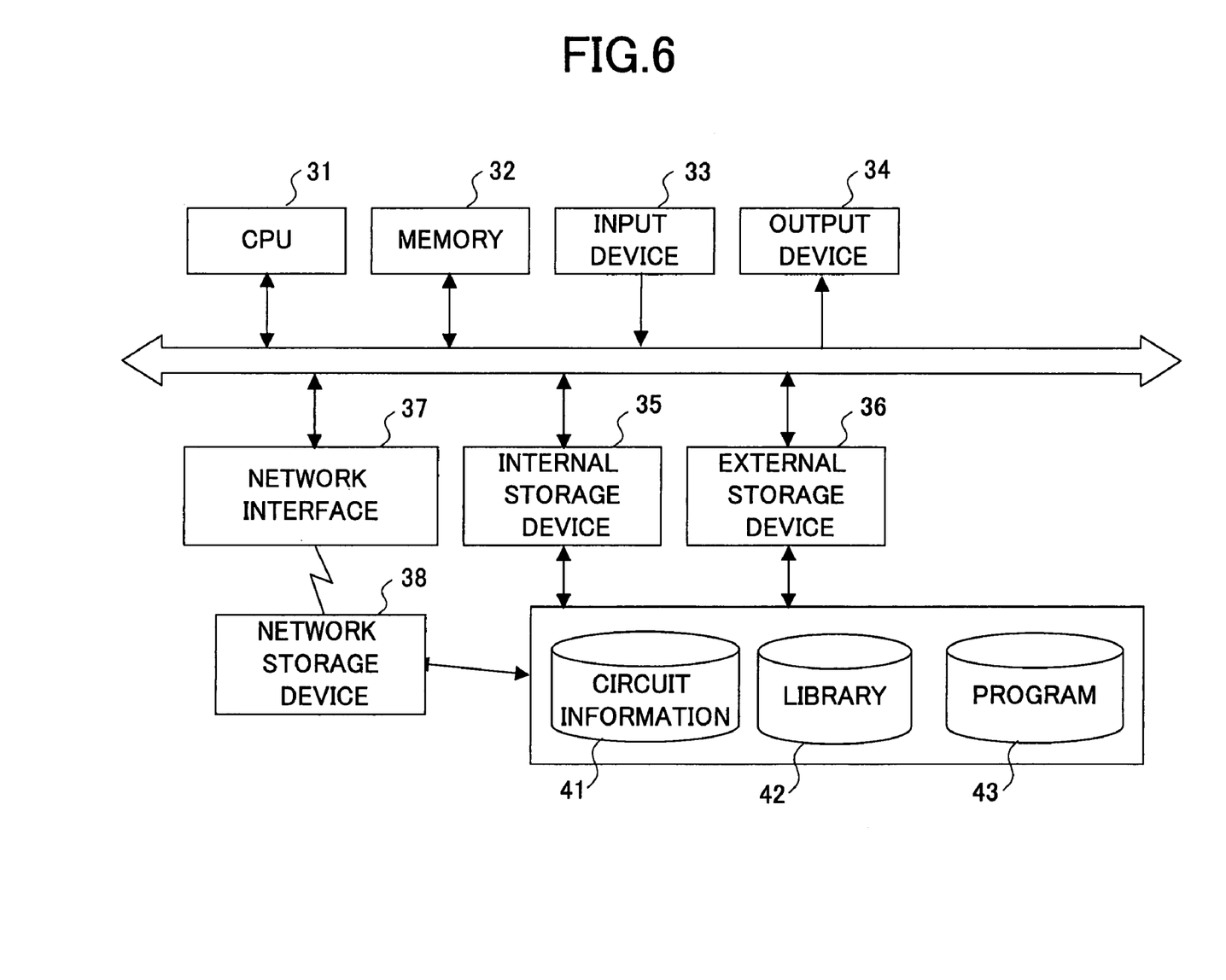
FIG. 6 is a block diagram showing an example of the construction of a semiconductor integrated circuit designing apparatus according to the invention.

FIG. 6 is a block diagram showing an example of the construction of a semiconductor integrated circuit designing apparatus according to the invention.

The semiconductor integrated circuit designing apparatus of FIG. 6 includes a CPU 31, a memory 32, an input device 33, an output device 34, an internal storage device 35, an external storage device 36, a network interface 37, and a network storage device 38 provided on the network. The CPU 31 controls each device based on basic control programs that are stored in the memory 32, and performs the method of designing a semiconductor integrated circuit according to the invention based on a program that is loaded to the memory 32 from the internal storage device 35, the external storage device 36, the network storage device 38, or the like. The input device 33 is comprised of a keyboard and mouse or the like for entering characters, numerical values, various instructions, etc. The output device 34 is a display, a printer, or the like for displaying or outputting information.

The internal storage device 35 is a hard drive or the like, and the external storage device 36 is a magnetic disc or the like. Connection to the network storage device 38 is provided via the network interface 37. The internal storage device 35, the external storage device 36, and the network storage device 38 store circuit information 41 about a circuit to be designed, a library 42 containing information and parameters regarding various cells, and a program 43 for performing the designing method of the invention. These data and program may be stored in one of the internal storage device 35, the external storage device 36, and the network storage device 38, or may be stored in each one of the storage devices.

In the following, a description will be given of a process of providing shielding lines and wiring prohibited areas inside the border of a physical block.

Figure 7:
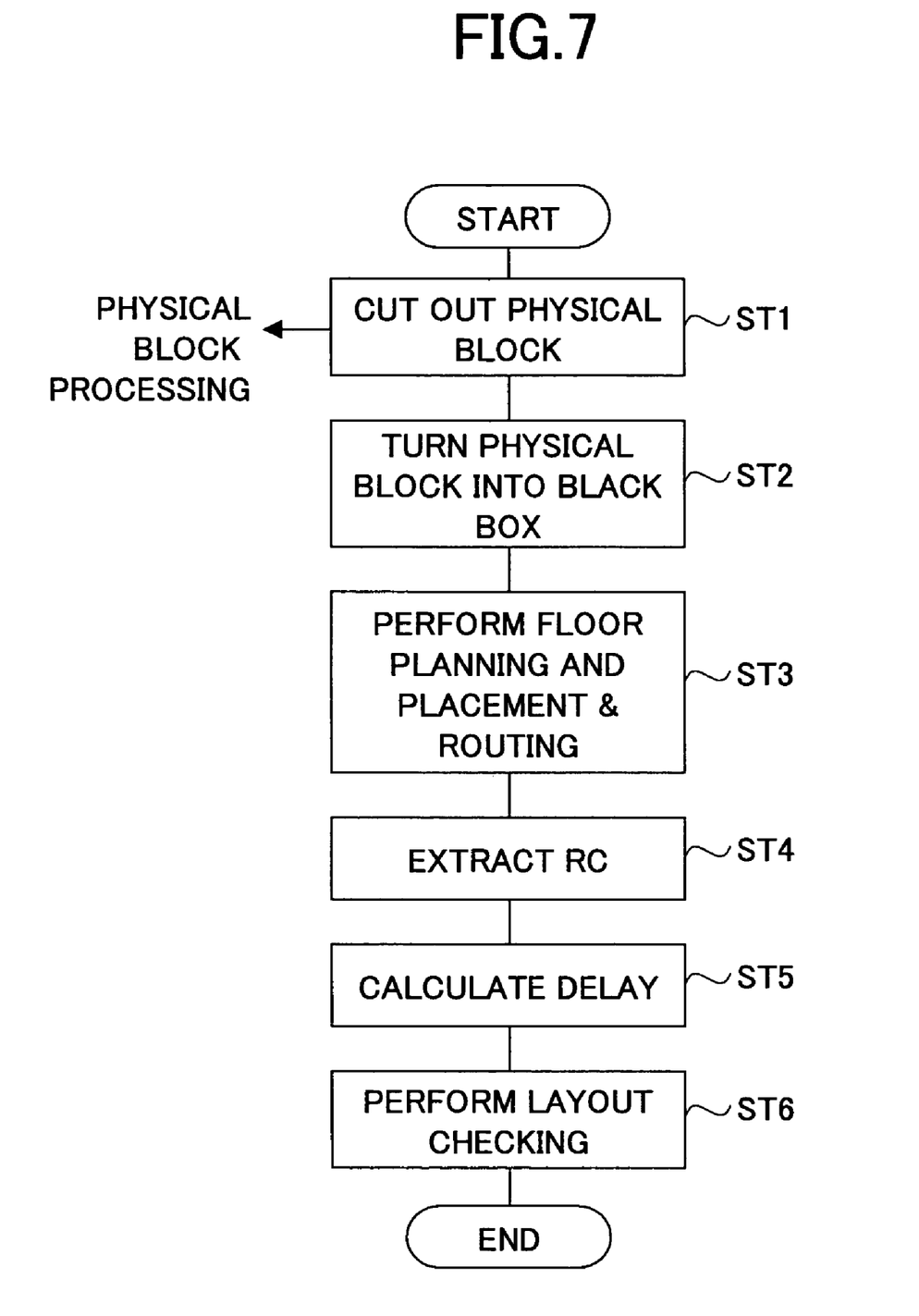
FIG. 7 is a flowchart showing a designing process at the top level.
Figure 8:
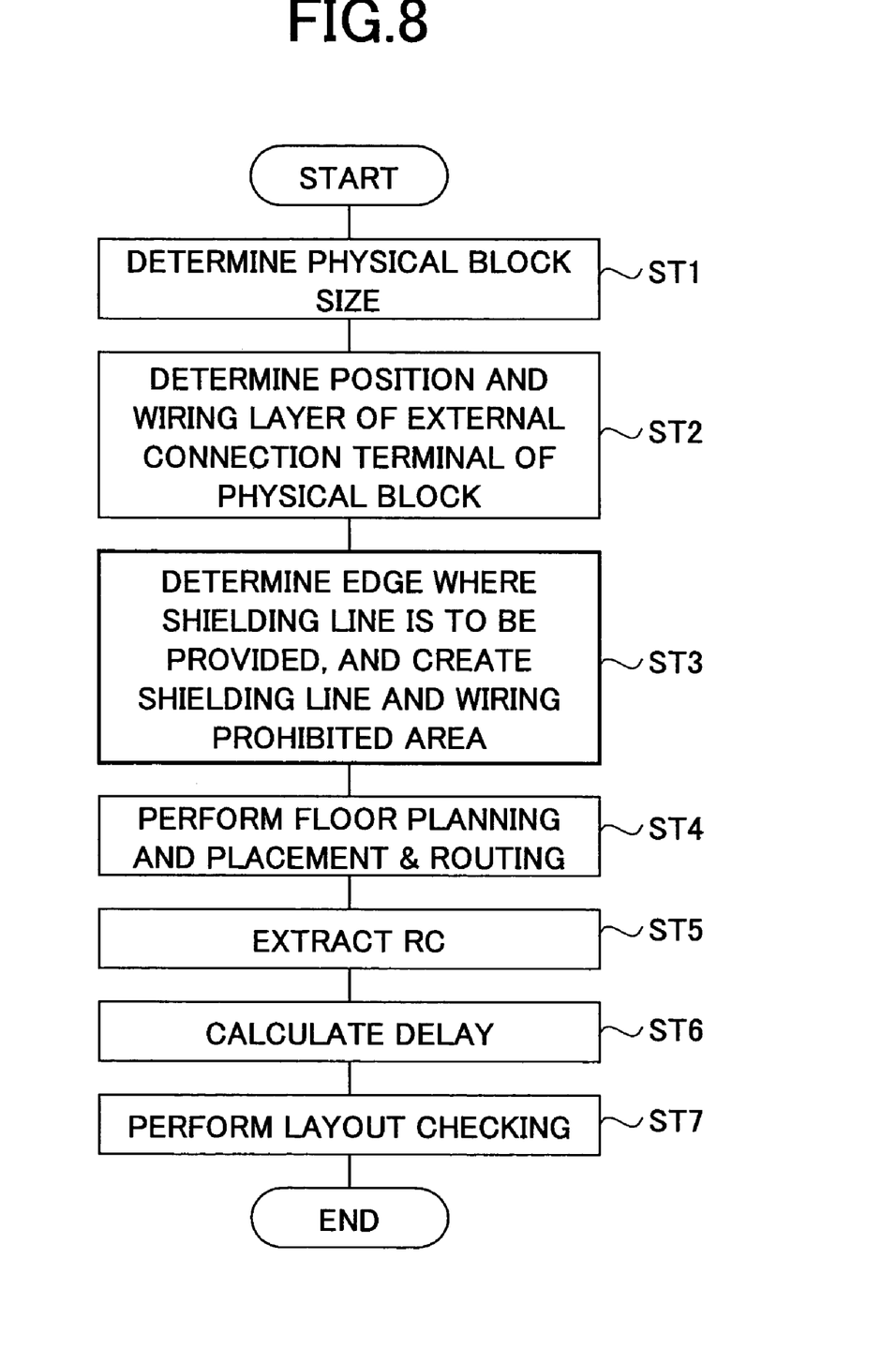
FIG. 8 is a flowchart showing a process of designing a physical block.

FIG. 7 is a flowchart showing a designing process at the top level. FIG. 8 is a flowchart showing a process of designing a physical block. The present invention is directed to hierarchical designing, and the process of FIG. 8 is performed with respect to layers below a layer that is processed by the process of FIG. 7.

At step ST1 of FIG. 7, physical blocks are cut out of a gate-level net-list that is provided at the top level. The cut-out net-lists corresponding to the physical blocks are handed to physical block designers, and the physical block designers start working (which marks the start of the flowchart of FIG. 8).

At step ST1 of FIG. 8, the size of a physical block is determined. At step ST2, the arrangement of the external connection terminals and a wiring layer in which the external connection terminals are arranged are determined. At step ST3, edges where shielding lines are provided and edges where wiring prohibited areas are provided are automatically determined based on the information about the position of the external connection terminals, followed by setting the shielding lines and the wiring prohibited areas inside the border of the physical block.

Thereafter, floor planning and placement & routing are performed (step ST4), and the extraction of resistance and capacitance (RC) is carried out (step ST5). Based on the extracted RC, delays are calculated (step ST6). A layout check is then made (step ST7) by checking whether the obtained delays satisfy desired timing requirements. In this manner, the design data of a physical block is created.

In the process described above, with respect to the edges where the shielding lines are provided, cross-talk effects and RC are extracted between the shielding lines and wiring lines situated inside the boarder of the physical block. With respect to the edges where the wiring prohibited areas are provided, wiring lines running parallel to the border of the physical block are prohibited, so that no wiring lines generating cross-talk and capacitance with the outside of the physical block exists inside the border of the physical block. Accordingly, the accuracy of RC obtained by the RC extraction is high with respect to this physical block.

With reference to FIG. 7 again, when the arrangement and wiring layer of the external connection terminals are determined for the physical blocks, information about the arrangement and wiring layer is given to the top level. Based on this information, the physical blocks are turned into black boxes like other macros (step ST2). As a result, the physical blocks turned into black boxes can be treated together with other macros in the same manner. Floor planning and placement & routing are performed (step ST3), and the extraction of RC is then carried out (step ST4). Based on the extracted RC, delays are calculated (step ST5). A layout check is then made (step ST6) by checking whether the obtained delays satisfy desired timing requirements. In this manner, the design data of the entire chip is obtained.

In the processing of extracting RC as described above, with respect to the edges of each physical block where the shielding lines are provided, processing is performed by assuming that wiring lines (shielding lines) are in existence inside the physical block close to the border. With respect to the edges where the wiring prohibited areas are provided, wiring lines running parallel to the border of the physical block are prohibited, so that no wiring lines generating cross-talk and capacitance with the outside of the physical block exists inside the border of the physical block. This allows processing to be performed by assuming that no wiring line exists near the border. Accordingly, when RC extraction following the generation of a layout is performed with respect to the top-level design data, the presence/absence of wiring lines is taken into account on an edge-by-edge basis, thereby maintaining high accuracy of the RC extraction.

In the following, a description will be given of a process of providing shielding lines and wiring prohibited areas outside the border of a physical block.

Figure 9:
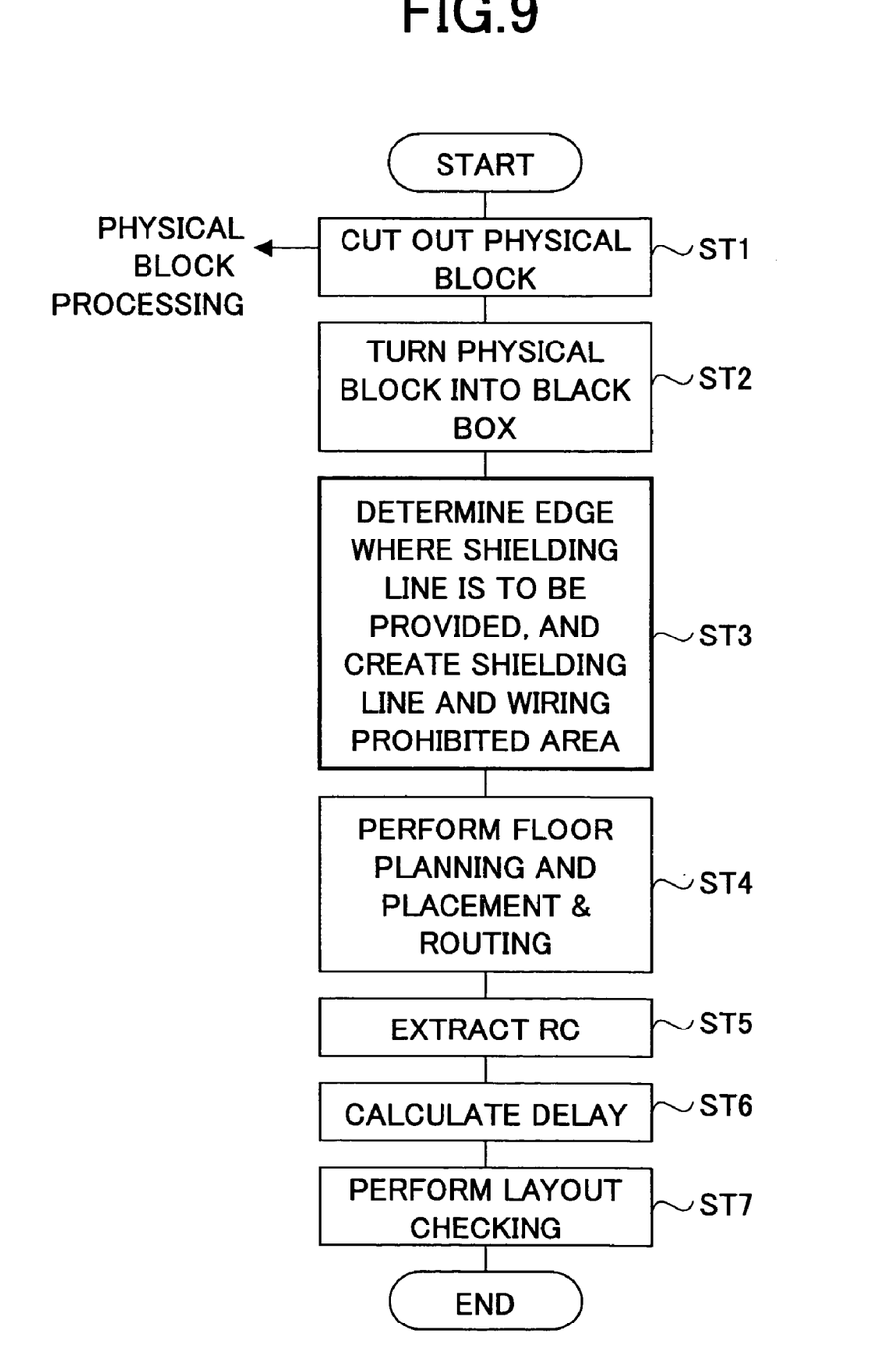
FIG. 9 is a flowchart showing a designing process at the top level.
Figure 10:
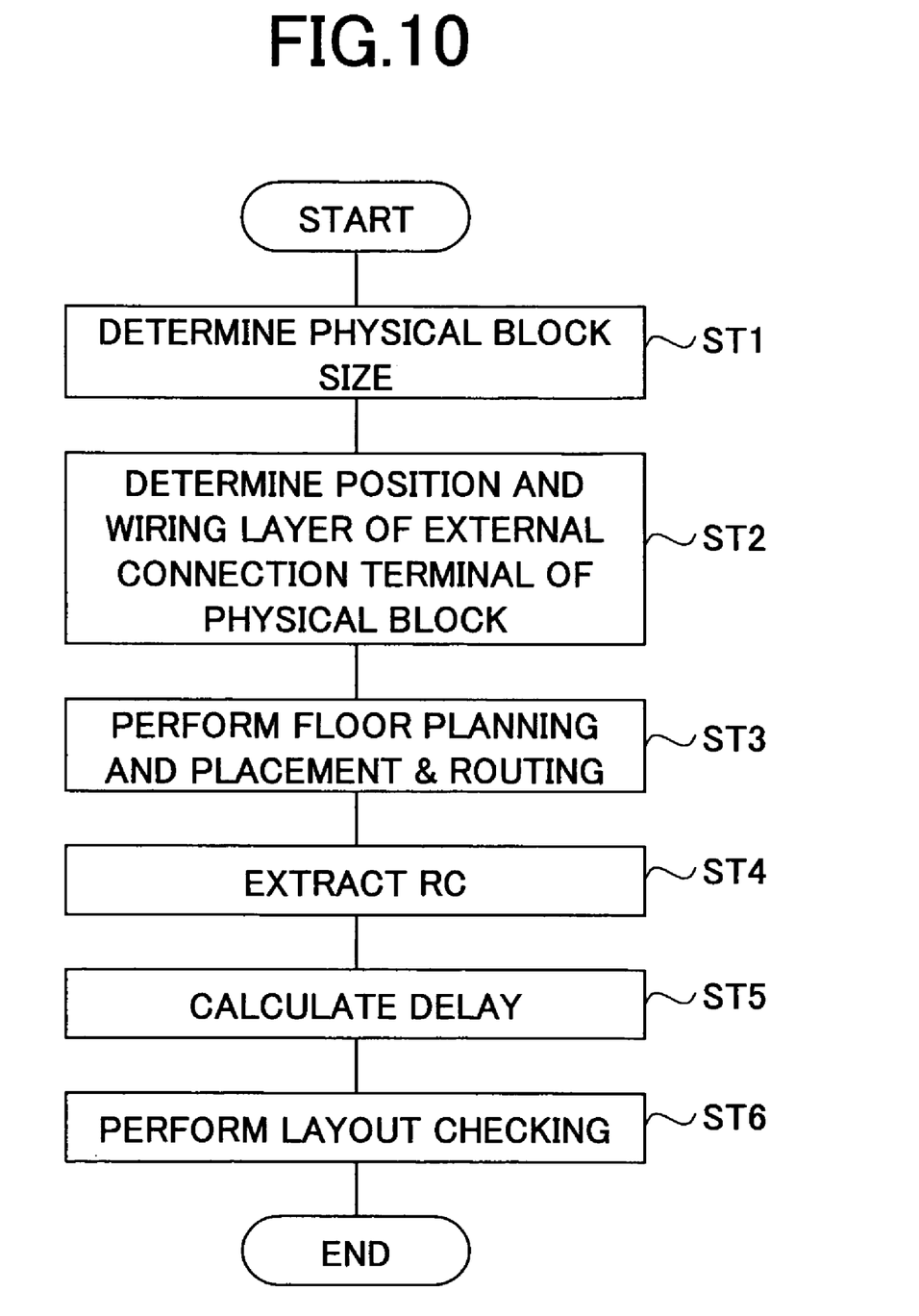
FIG. 10 is a flowchart showing a process of designing a physical block.

FIG. 9 is a flowchart showing a designing process at the top level. FIG. 10 is a flowchart showing a process of designing a physical block.

At step ST1 of FIG. 9, physical blocks are cut out of a gate-level net-list that is provided at the top level. The cut-out net-lists corresponding to the physical blocks are handed to physical block designers, and the physical block designers start working (which marks the start of the flowchart of FIG. 10).

At step ST1 of FIG. 10, the size of a physical block is determined. At step ST2, the arrangement of the external connection terminals and a wiring layer in which the external connection terminals are arranged are determined. Thereafter, floor planning and placement & routing are performed (step ST3), and the extraction of RC is carried out (step ST4). Based on the extracted RC, delays are calculated (step ST5). A layout check is then made (step ST6). In this manner, the design data of a physical block is created.

With reference to FIG. 9 again, when the arrangement and wiring layer of the external connection terminals are determined for the physical blocks, information about the arrangement and wiring layer is given to the top level. Based on this information, the physical blocks are turned into black boxes like other macros (step ST2). Based on the information about the arrangement of the external connection terminals, edges where shielding lines are provided and edges where wiring prohibited areas are provided are automatically determined for each physical block, followed by setting the shielding lines and the wiring prohibited areas outside the border of the physical block (step ST3). Floor planning and placement & routing are performed (step ST4), and the extraction of RC is then carried out (step ST5). Based on the extracted RC, delays are calculated (step ST6). A layout check is then made (step ST7). In this manner, the design data of the entire chip is obtained.

Figure 11:
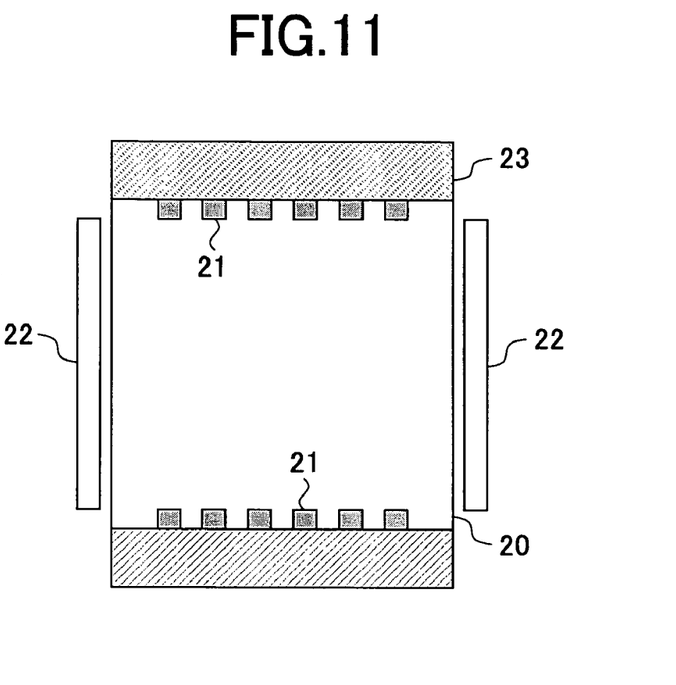
FIG. 11 is a plan view showing the structure of shielding lines and wiring prohibited areas that are provided outside the border of a physical block.

FIG. 11 is a plan view showing the structure of shielding lines and wiring prohibited areas that are provided outside the border of a physical block. In FIG. 11, the physical block 20 includes the external connection terminals 21. Outside the physical block 20, the shielding lines 22 and the wiring prohibited areas 23 are provided.

In the top-level processing described above, with respect to the edges where the shielding lines are provided, cross-talk effects and RC are properly extracted between the shielding lines and wiring lines situated outside the boarder of a physical block. With respect to the edges where the wiring prohibited areas are provided, an effect of wiring lines inside the physical block does not need to be taken into account at the time of extracting cross-talk effects and RC. Accordingly, the high accuracy of RC extraction is maintained when RC is extracted at the top level.

In the processing of extracting RC inside each physical block, with respect to the edges where the shielding lines are provided, processing is properly performed by assuming that wiring lines (shielding lines) are in existence outside the physical block close to the border. With respect to the edges where the wiring prohibited areas are provided, processing is properly performed by assuming that no wiring line exists near the border. Accordingly, high accuracy is maintained for RC extraction.

In the following, a description will be given of a process of providing shielding lines and wiring prohibited areas inside and outside the border of a physical block.

In order to provide shielding lines and wiring prohibited areas inside and outside the border of a physical block, the process of FIG. 9 for providing shielding lines and wiring prohibited areas outside the border of a physical block is simply combined with the process of FIG. 8 for providing shielding lines and wiring prohibited areas inside the border of a physical block. As a result, shielding lines and wiring prohibited areas are provided inside the border of a physical block at step ST3 of FIG. 8, and shielding lines and wiring prohibited areas are provided outside the border of a physical block at step ST3 of FIG. 9. Other part of the processes remains the same as the previously described processes.

Figure 12:
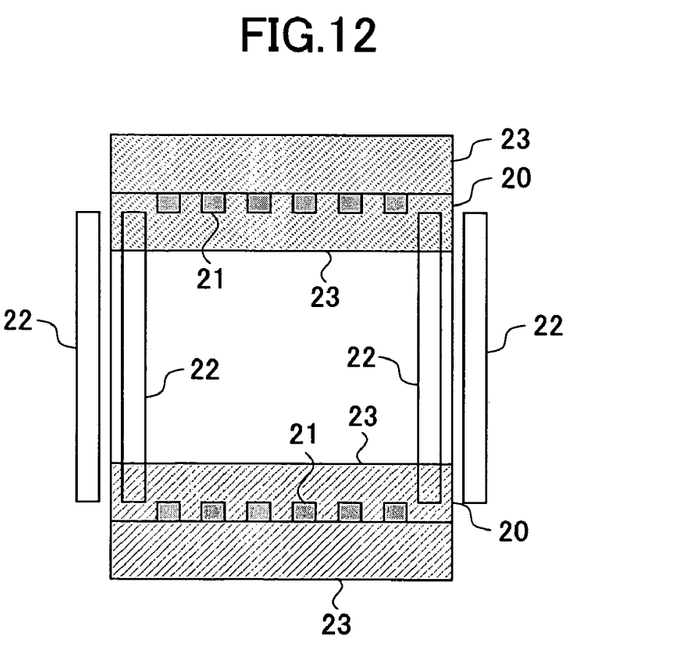
FIG. 12 is a plan view showing the structure of shielding lines and wiring prohibited areas that are provided inside and outside the border of a physical block.

FIG. 12 is a plan view showing the structure of shielding lines and wiring prohibited areas that are provided inside and outside the border of a physical block. In FIG. 12, the shielding lines 22 and the wiring prohibited areas 23 are provided inside and outside the physical block 20 that includes the external connection terminals 21.

With this structure, high accuracy is maintained for RC extraction in the same manner as with the structure of FIG. 4 or the structure of FIG. 11.

Figure 13:
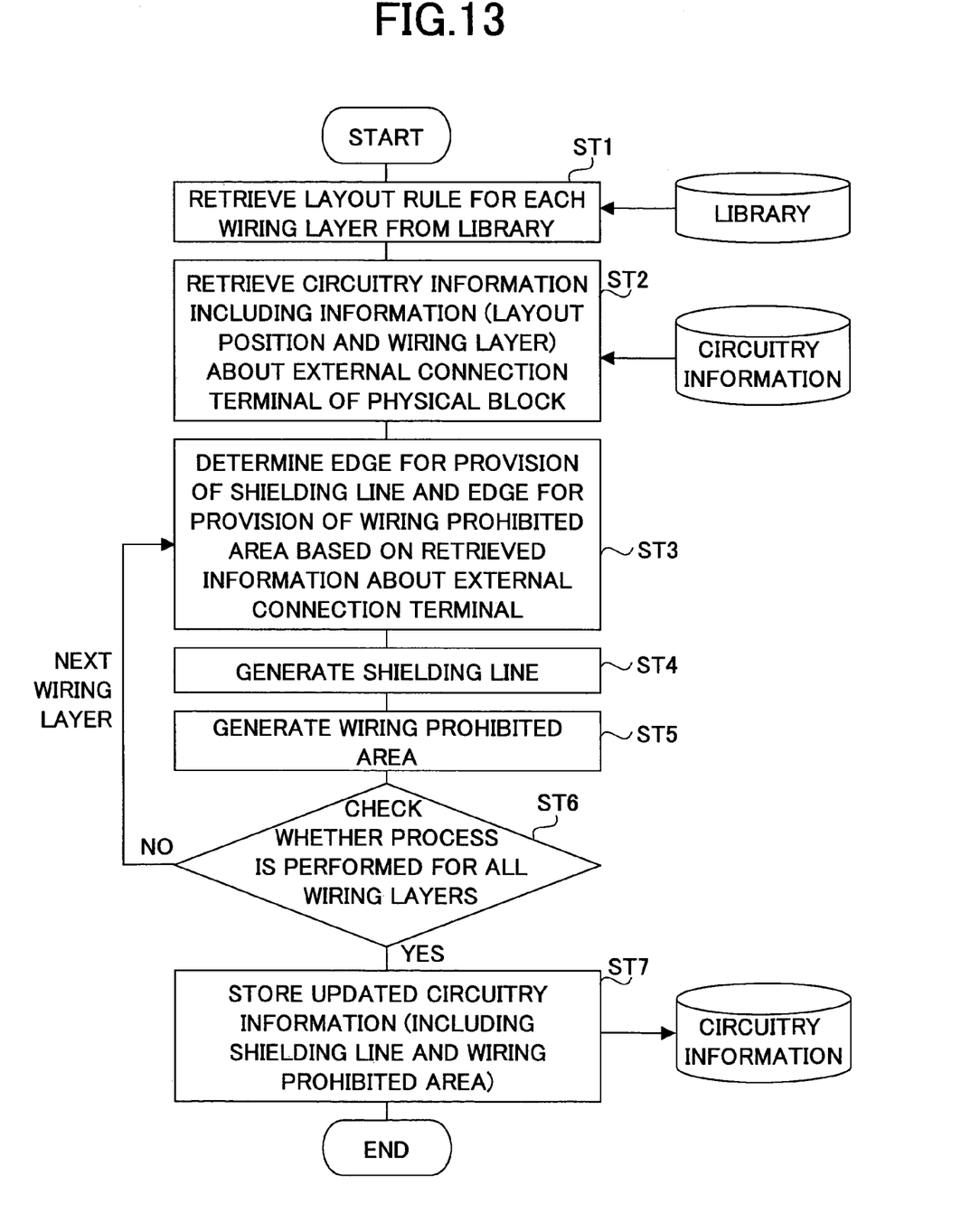
FIG. 13 is a flowchart showing a process of determining edges where shielding lines are provided and of setting the shielding lines and wiring prohibited areas.

FIG. 13 is a flowchart showing a process of determining edges where shielding lines are provided and of setting the shielding lines and wiring prohibited areas. This process shows the detail of the process of step ST3 shown in FIG. 8 or FIG. 9.

At step ST1, layout rules for each wiring layer are retrieved from the library. At step ST2, circuitry information on a physical block to be processed is retrieved. The circuitry information includes information about the position (arrangement) and wiring layer of external connection terminals of the physical block.

At step ST3, information about the external connection terminals of the physical block is extracted from the retrieved circuitry information, and a check is made with respect to each wiring layer as to which edges of the physical block have external connection terminals, followed by determining edges for the provision of shielding lines and edges for the provision of wiring prohibited areas on a wiring-layer-by-wiring-layer basis.

At step ST4, shielding lines are generated based on the layout rules retrieved from the library. If a wiring line is laid out between a shielding line and the border of the physical block, the purpose of shielding is undermined. The position of shielding line generation is thus set at such a distance from the border of the physical block that no other wiring line can exist between the shielding line and the border of the physical block.

At step ST5, wiring prohibited areas are generated with respect to the edges for the provision of wiring prohibited areas. The width of wiring prohibited areas (i.e., the distance from the border of a physical block to the end of a wiring prohibited area) is determined by simulation such that no cross-talk effect and wiring capacitance needs to be taken into account. The obtained width is kept in the library in advance.

At the step ST6, a check is made as to whether the process described above is completed with respect to all the wiring layers. In the case of a negative check result, the procedure goes back to step ST3, from which the process described above will be performed with respect to a next wiring layer. When the setting of shielding lines and wiring prohibited areas is completed with respect to all the wiring layers, the procedure goes to step ST7. At step ST7, the original circuitry information is updated by the circuitry information that includes the shielding lines and the wiring prohibited areas.

With this, the procedure comes to an end.

Figure 14A:
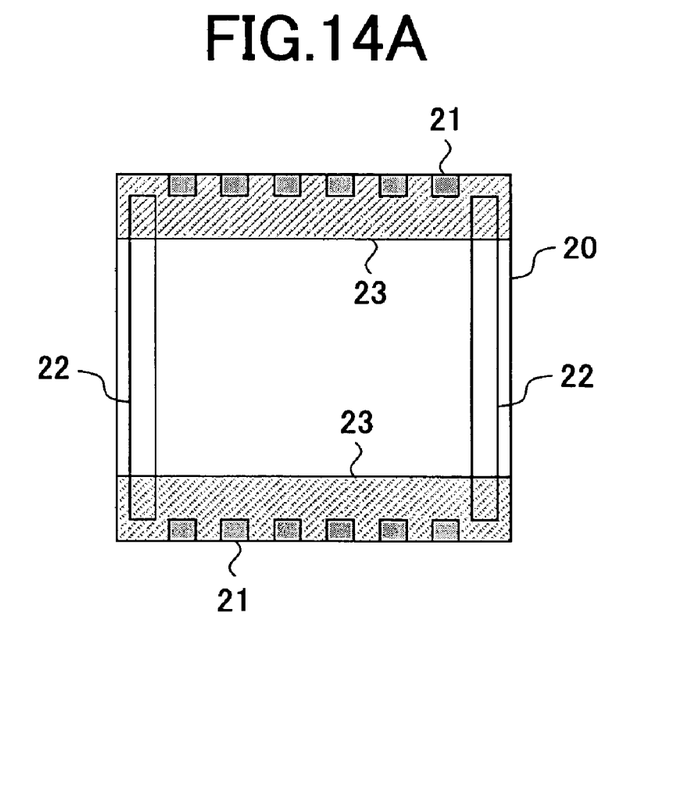
FIGS. 14A and 14B are illustrative drawings showing the structure of a semiconductor integrated circuit when layers of the wiring layer as shown in FIG. 4 are stacked one over another.
Figure 14B:
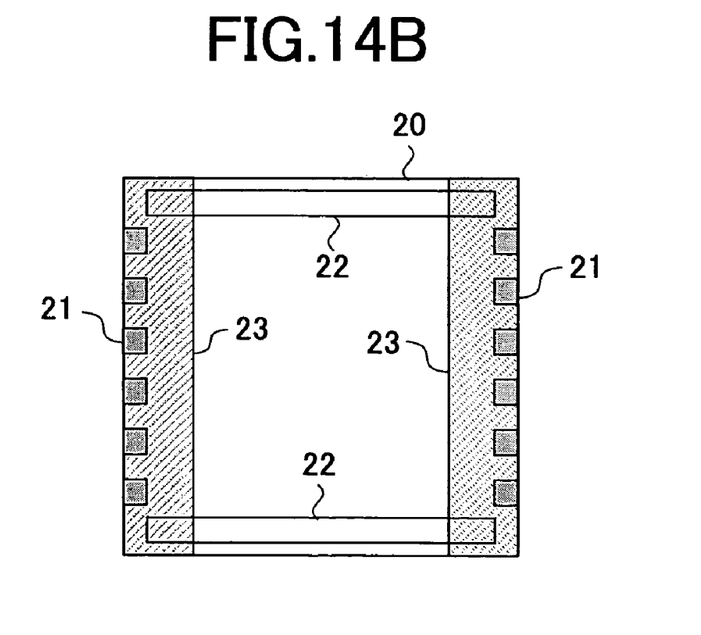

FIGS. 14A and 14B are illustrative drawings showing the structure of a semiconductor integrated circuit when layers of the wiring layer as shown in FIG. 4 are stacked one over another.

FIG. 14A shows a first wiring layer, and FIG. 14B shows a second wiring layer. In a semiconductor integrated circuit having a multi-layered structure, a plurality of wiring layers are stacked one over another, so that the second wiring layer of FIG. 14B is stacked on top of the first wiring layer of FIG. 14A. In the example shown in FIGS. 14A and 14B, the layer-specific priority wiring direction is a vertical direction for the first wiring layer of FIG. 14A, and is a horizontal direction for the second wiring layer of FIG. 14B. In general, a vertical priority wiring direction and a horizontal priority wiring direction alternate in the plurality of wiring layers.

In the wiring layer shown in FIG. 14A, the shielding lines 22 are provided on the left edge and the right edge while the wiring prohibited areas 23 are situated on the top edge and the bottom edge. In the wiring layer shown in FIG. 14B, the shielding lines 22 are provided on the top edge and the bottom edge while the wiring prohibited areas 23 are situated on the left edge and the right edge. These wiring layers are stacked one over the other. The method of setting the shielding lines 22 and the wiring prohibited areas 23 in each wiring layer is the same as the previously described method.

The structure of FIG. 11 or FIG. 12 may also be applied to a semiconductor integrated circuit having a multi-layered structure. In such a multi-layered structure, the structure of FIG. 11 or FIG. 12 having the shielding lines 22 extending in the vertical direction and having the wiring prohibited areas 23 extending in the horizontal direction alternates with the structure having the shielding lines 22 extending in the horizontal direction and having the wiring prohibited areas 23 extending in the vertical direction.

Further, the present invention is not limited to these embodiments, but various variations and modifications may be made without departing from the scope of the present invention.

The present application is based on Japanese priority application No. 2003-049375 filed on Feb. 26, 2003, with the Japanese Patent Office, the entire contents of which are hereby incorporated by reference.

What is claimed is:

1. A method of designing a semiconductor integrated circuit, comprising:

checking each border edge of a block area so as to determine whether a border edge is a first border edge where an external connection terminal is provided or a second border edge where no external connection terminal is provided;

providing a wiring prohibited area which extends a first distance from the first border edge and in which no wiring line running parallel to the first border edge exists;

providing a shielding line which is at a second distance from the second border edge and runs parallel to the second border edge;

determining a layout of the block area through floor planning, placement and routing;

extracting resistance and capacitance from the layout, for delay calculation and layout check, by utilizing the wiring prohibited area for the first border edge and the shielding line for the second border edge; and completing a layout of the block area through the delay calculation and layout check.

2. The method as claimed in claim 1, further comprising cutting out a physical block as said block area, said physical block being a layout area divided on a function-by-function basis at a top level in hierarchical layout designing.

3. The method as claimed in claim 1, wherein said checking, providing a wiring prohibited area and providing a shielding line are repeated with respect to each wiring layer.

4. The method as claimed in claim 1, wherein the first distance is longer than a minimum wiring distance.

5. The method as claimed in claim 1, wherein the second distance is equal to a minimum wiring distance.

* * * * *